(12) United States Patent
Hayashi (10) Patent No.: US 10,720,912 B2
(45) Date of Patent: Jul. 21, 2020

(54) SUPPRESSING CIRCUIT FOR SEMICONDUCTOR SWITCH

(71) Applicant: DENSO CORPORATION, Kariya, Aichi-pref. (JP)

(72) Inventor: Yoshinori Hayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/406,299

(22) Filed: May 8, 2019

(65) Prior Publication Data

US 2019/0348980 A1    Nov. 14, 2019

(30) Foreign Application Priority Data

May 8, 2018    (JP) .................. 2018-090170

(51) Int. Cl.
*H03K 17/0812*    (2006.01)
*H02M 3/158*    (2006.01)
*H02M 7/5387*    (2007.01)
*H02M 1/08*    (2006.01)
*H02P 27/08*    (2006.01)

(52) U.S. Cl.
CPC ........ *H03K 17/08128* (2013.01); *H02M 1/08* (2013.01); *H03K 17/08122* (2013.01); *H02M 3/158* (2013.01); *H02M 7/53871* (2013.01); *H02P 27/08* (2013.01)

(58) Field of Classification Search
CPC .. H03K 17/08; H03K 17/081; H03K 17/0812; H03K 17/08122; H03K 17/08128; H02M 1/08; H02M 1/088; H02M 1/096; H02M 3/02; H02M 3/04; H02M 3/10; H02M 3/145; H02M 3/155; H02M 3/156; H02M 3/158; H02M 7/42; H02M 7/44; H02M 7/48; H02M 7/53; H02M 7/537; H02M 7/5387; H02M 7/53871; H02P 27/02; H02P 27/06; H02P 27/08
See application file for complete search history.

(56) References Cited

U.S. PATENT DOCUMENTS 5,705,877 A * 1/1998 Shimada ............... H01L 41/044
310/318
2015/0131350 A1    5/2015 Isomura et al.

* cited by examiner

*Primary Examiner* — Lincoln D Donovan
*Assistant Examiner* — Diana J. Cheng
(74) *Attorney, Agent, or Firm* — Oliff PLC (57) ABSTRACT

A suppressing circuit is provided with a diode of which an anode is connected to a first neutral point between a drive circuit and a control electrode of a semiconductor switch; a capacitor disposed between a cathode of the diode and a reference potential; a constant voltage circuit connected to a second neutral point between the diode and the capacitor; an adjusting resistor disposed between the constant voltage circuit and the second neutral point; and a cutoff switch disposed between a constant voltage circuit side of the adjusting resistor and the reference potential.

3 Claims, 6 Drawing Sheets

SUPPRESSING CIRCUIT FOR SEMICONDUCTOR SWITCH

CROSS-REFERENCE TO RELATED APPLICATION

This application is based on and claims the benefit of priority from earlier Japanese Patent Application No. 2018-90170 filed May 8 2018, the description of which is incorporated herein by reference.

BACKGROUND

Technical Field

The present disclosure relates to a suppressing circuit connected to a control electrode of a semiconductor switch.

Description of the Related Art

Conventionally, a power conversion circuit including two transistors connected in series has been known. The power conversion circuit is provided with a clamp circuit that suppresses an increase in the gate voltage of a transistor. The clamp circuit suppresses an increase in current flowing through the transistor.

SUMMARY

The present disclosure provides a suppressing circuit including a diode; a capacitor; a constant voltage circuit connected between the diode and the capacitor; an adjusting resistor; and a cutoff switch disposed between a constant voltage circuit side of the adjusting resistor and the reference potential.

DETAILED DESCRIPTION OF THE PREFERRED EMBODIMENTS

Hereinafter, with reference to the drawings, embodiments of the present disclosure will be described.

First Embodiment

On-vehicle system:

First, an on-vehicle system 100 including a suppressing circuit 10 will be described with reference to FIG. 1. The on-vehicle system 100 constitutes a system for an electric vehicle. The on-vehicle system 100 is provided with a battery 200, a power converter 300 and a motor 400.

The on-vehicle system 100 includes a plurality of ECUs (i.e. electronic control units). FIG. 1 illustrates a battery ECU 501 and a MGECU 502 as representative ECUs in the plurality of ECUs. These ECUs transmit/receive signals from each other via a bus wiring 500. The plurality of ECUs controls an electric vehicle in a coordinated manner. With a control of the plurality of ECUs, a regenerative operation and a power running operation of the motor 400 based on the SOC (i.e. state of charge) of the battery 200.

The ECU includes at least one arithmetic unit (CPU) and at least one memory unit (MMR) as a recording media storing a program and data. The ECU is a microprocessor provided with recording media capable of being read by a computer. The recording media is non-transitory tangible recording media that stores computer readable programs in a non-transitory manner. The recording media may be configured for example as a semiconductor memory or a magnetic disk. Hereinafter, each of the elements in the on-vehicle system 100 will be briefly described.

The battery 200 includes a plurality of secondary batteries. The secondary batteries constitute a battery stack in which the secondary batteries are connected in series. The SOC of the battery stack corresponds to the SOC of the battery 200. As the secondary batteries, lithium ion secondary batteries, nickel hydrogen batteries and organic radical batteries may be employed.

The power converter 300 converts power between the battery 200 and the motor 400. The power converter 300 converts a DC power of the battery 200 into an AC power required for the power running operation of the motor 400. The power converter 300 converts the AC power generated by the power generation (regeneration) of the motor 400 into a DC power having a required voltage level for charging of the battery 200. The power converter 300 will be described in detail.

The motor 400 is coupled to the output shaft of the electric vehicle which is not shown. The rotational energy of the motor 400 is transmitted to the driving wheels of the electric vehicle via the output shaft. On the other hand, the rotational energy of the driving wheels is transmitted to the motor 400 via the output shaft.

The motor 400 performs a power running operation using the AC power supplied by the power converter 300. Thus, a driving force is applied to the driving wheels. The motor 400 performs regeneration operation using the rotational energy transmitted from the driving wheels. The AC power generated from the regeneration is converted to DC power by the power converter 300 and stepped down. The DC voltage is supplied to the battery 200. The DC power is also supplied to various electrical loads mounted on the electric vehicle.

Power Converter:

Next, the power converter 300 will be described. The power converter 300 is provided with a converter 310 and an inverter 320.

The converter 310 boosts the DC power of the battery 200 to a voltage level required for the power running operation of the motor 400. The inverter 320 converts the DC power into an AC power. The AC power is supplied to the motor 400. The inverter 320 converts the AC power generated by the motor 400 into a DC power. The converter 310 steps down the DC power to a voltage level required for charging of the battery 200.

Figure 1:
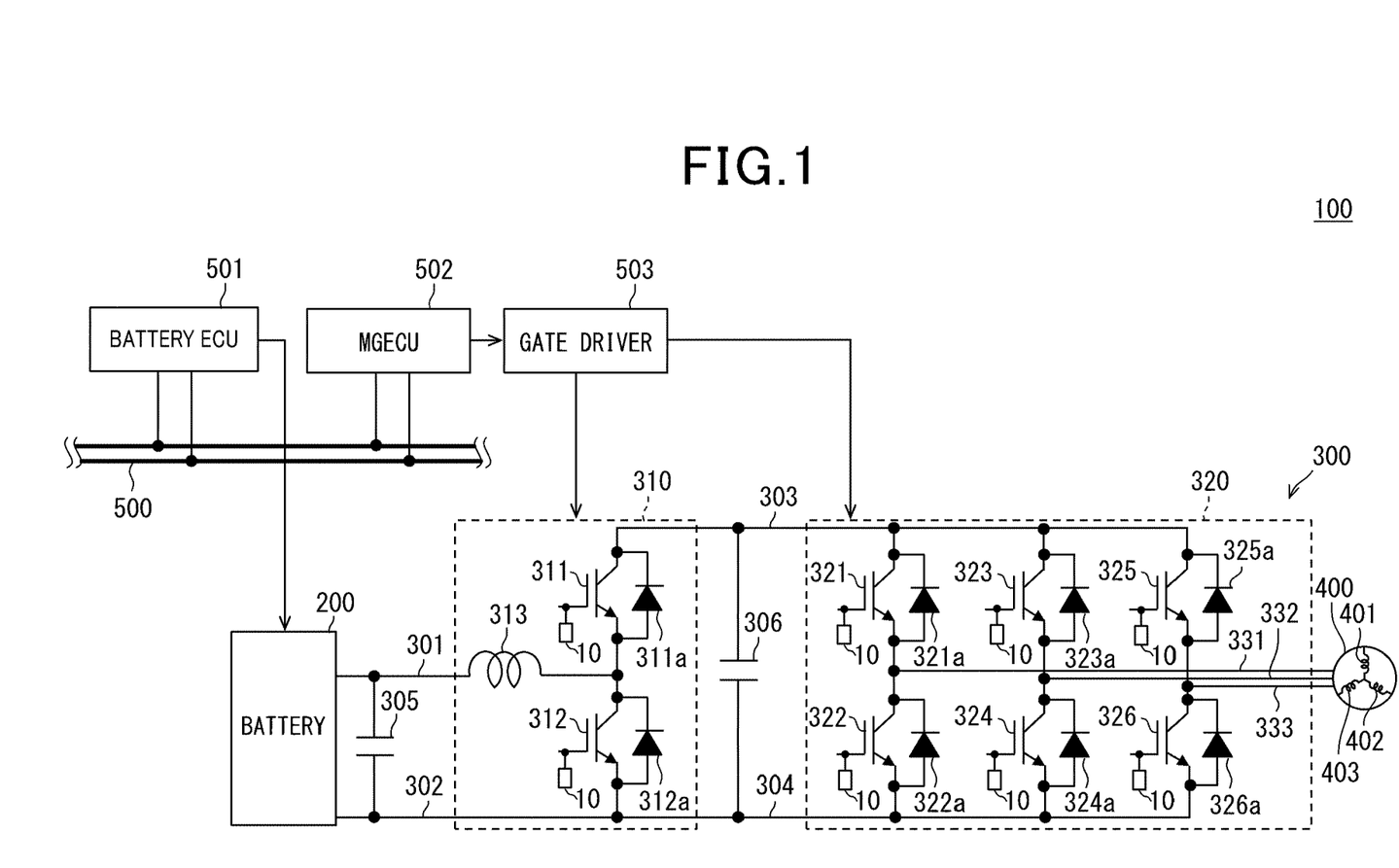
FIG. 1 is a circuit diagram illustrating an on-vehicle system.

As shown in FIG. 1, the converter 310 is electrically connected to the battery 200 via a first power line 301 and a second power line 302. The converter 310 is electrically connected to the inverter 320 via a third power line 303 and a fourth power line 304.

The first power line 301 is connected to a positive electrode of the battery 200. The second power line 302 is connected to the negative electrode of the battery 200. A smoothing capacitor 305 is connected between the first power line 301 and the second power line 302. Either one electrode in two electrodes of the first smoothing capacitor 305 is connected to the third power line 303, and the other electrode is connected to the fourth power line 304.

The third power line 303 is connected to a high side switch 311 which will be described later. The fourth power line 304 is connected to the second power line 302. A second smoothing capacitor 306 is connected between the third power line 303 and the fourth power line 304. Either one electrode in two electrodes of the second smoothing capacitor 306 is connected to the third power line 303, and the other electrode is connected to the fourth power line 304.

The inverter 320 is electrically connected to U-phase stator coil 401 to W-phase stator coil 403 via U-phase bus bar 331 to W-phase bus bar 333.

Converter:

The converter 310 includes a high side switch 31, a low side switch 312, a high side diode 311a, a low side diode 312a and a reactor 313. For this high side switch 311 and the low side switch 312, an IGBT (i.e. insulated gate bipolar transistor) or a power MOSFET may be employed. According to the present embodiment, an n-channel IGBT is employed for the high side switch 311 and the low side switch 312.

In the case where MOSFETs are used for the high side switch 311 and the low side switch 312, since body diodes are formed in the MOSFETs, the high side diode 311a and the low side diode 312a are unnecessary. The semiconductor elements which constitute the converter 310 are manufactured using a semiconductor such as Si, or a wide-bandgap semiconductor such as SiC. A material for producing the semiconductor element is not limited.

The high side diode 311a is connected in parallel to the high side switch 311 in the reverse direction. In other words, the cathode of the high side diode 311a is connected to the collector of the high side switch 311, and the anode of the high side diode 311a is connected to the emitter of the high side switch 311.

Similarly, the low side diode 312a is connected in parallel to the low side switch 312 in the reverse direction. In other words, the cathode of the low side diode 312a is connected to the collector of the low side switch 312, and the anode of the low side diode 312a is connected to the emitter of the low side switch 312.

As shown in FIG. 1, the third power line 303 is connected to the collector of the high side switch 311. The emitter of the high side switch 311 and the collector of the low side switch 312 are connected. The second power line 302 and the fourth power line 304 are electrically connected to the emitter of the low side switch 312.

According to the above-described connection, the high side switch 311 and the low side switch 312 are series-connected in this order from the third power line 303 to the second power line. In other words, the high side switch 311 and the low side switch 312 are series-connected in this order from the third power line 303 to the fourth power line 304.

Also, the first power line 301 is connected to the middle point between the high side switch 311 and the low side switch 312. The reactor 313 is disposed on the first power line 301. Thus, the reactor 313 is connected to the middle point between the high side switch 311 and the low side switch 312, and the positive electrode of the battery 200.

The high side switch 311 and the low side switch 312 of the converter 310 is controlled to be ON and OFF by the MGECU 502. The MGECU 502 generates a control signal and outputs the generated control signal to the gate driver 503. The gate driver 503 amplifies the control signal and outputs the amplified control signal to the gate electrodes of the switches. Thus, the MGECU 502 boosts or steps down the voltage level of the DC power inputted to the converter 310. The gate driver 503 corresponds to a drive circuit.

The MGECU 502 generates a pulse signal as a control signal. The MEGECU 502 adjusts the ON-duty ratio of the pulse signal, thereby adjusting boost or stepdown voltage of the DC power. Thus, the MGECU 502 performs a PWM (i.e. pulse width modulation) control of the converter. The boost or stepdown voltage level is determined depending on a target torque or SOC of the battery 200.

When the DC power of the battery 200 is required to be boosted, the MGECU 502 controls the high side switch 311 and the low side switch 312 to be alternately ON and OFF. On the other hand, when the DC power supplied from the inverter 320 is required to be stepped down, the MGECU 502 controls the control signal being outputted to the low side switch 312, to be low level. Further, the MGECU 502 subsequently switches the control signal being outputted to the high side switch 311, to be between a high level and low level.

Inverter:

The inverter 320 includes a first switch 321 to a sixth switch 326, and a first diode 321a to a sixth diode 326a. For the first switch 321 to sixth switch 326, IGBT or power MOSFET can be employed.

According to the present embodiment, for the first switch 321 to the sixth switch 326, n-channel IGBTs are employed. In the case where MOSFETs are used for these switches, the above-described diodes are unnecessary. The semiconductor elements which constitute the inverter 320 are manufactured using a semiconductor such as Si, or a wide-bandgap semiconductor such as SiC. A material for producing the semiconductor element is not particularly limited.

The first diode 321a to the sixth diode 326a corresponding to the first switch 321 to the sixth switch 326 are connected in parallel to respective switches in the reverse direction. In other words, assuming that k is defined as natural number of 1 to 6, the cathode of the kth diode is connected to the collector of the kth switch. The anode of the kth diode is connected to the emitter of the kth switch.

The first switch 321 and the second switch 322 are series-connected in this order from the third power line 303 to the forth power line 304. The first switch 321 and the second switch 322 constitute a U-phase leg. One end of the U-phase bus bar 331 is connected to the mid point between the first switch 321 and the second switch 322. The other end of the U-phase bus bar 331 is connected to the U-phase stator coil 401 of the motor 400. The first diode 321a is connected in parallel to the first switch 321 in the reverse direction. The second diode 322a is connected in parallel to the second switch 322 in the reverse direction.

The third switch 323 and the fourth switch 324 are series-connected in this order from the third power line 303 to the fourth power line 304. The third switch 323 and the fourth switch 324 constitute the V-phase leg. One end of the V-phase bus bar 332 is connected to the mid point between the third switch 323 and the fourth switch 324. The other end of the V-phase bus bar 332 is connected to the V-phase stator coil 402 of the motor 400. The third diode 323a is connected in parallel to the third switch 323 in the reverse direction.

The fourth diode 324a is connected in parallel to the fourth switch 324 in the reverse direction.

The fifth switch 325 and the sixth switch 326 are series-connected in this order from the third power line 303 to the fourth power line 304. The fifth switch 325 and the sixth switch 326 constitute the w-phase leg. One end of the W-phase bus bar 333 is connected to the mid point between the fifth switch 325 and the sixth switch 326. The other end of the W-phase bus bar 333 is connected to the W-phase stator coil 403 of the motor 400. The fifth diode 325a is connected in parallel to the fifth switch 325 in the reverse direction. The sixth diode 326a is connected in parallel to the sixth switch 326 in the reverse direction.

As described, the inverter 320 includes three phase legs corresponding to the U-phase stator coil 401 to the W-phase stator coil 403 of the inverter 320. The control signals of the MGECU 502 which are amplified by the gate driver 503 are applied to the gate electrodes of the first switch 321 to the sixth switch 326 which constitute the three-phase legs.

When the motor 400 performs the power running operation, the first switch 321 to the sixth switch 326 are controlled with PWM by the control signals outputted by the MGECU 502. Thus, the inverter 320 generates three-phase AC current. In the case the motor 400 generates power (i.e. regeneration), the MGECU 502 stops outputting the control signals, for example. Hence, the AC current generated by the motor 400 flows through the first diode 321a to sixth diode 326a. As a result, AC power is converted into DC power.

Increase in an amount of conduction current:

Next, an increase in current flowing through switches which constitute the power converter 300 will be described. The switches constituting the power converter 300 correspond to semiconductor switch.

The output voltage of the battery 200 outputted to the converter 310 is around 300 V. When the motor 400 performs power running operation, the converter 310 boosts the voltage outputted from the battery 200 to be 600 V. The boosted voltage, i.e. 600 V is outputted to the inverter 320. Thus, high voltage is applied to the converter 310 and the inverter 320.

As described, the MGECU 502 performs PWM control for the high side switch 311, the low side switch 312 and the first switch 321 to the sixth switch 326. In this case, for example, if the first switch 321 and the second switch 322 constituting the U-phase leg were to be ON simultaneously, current would flow through the first switch 321 and the second switch 322 based on the ON resistance of these switches and the applied voltage of 600 V. Hence, a large amount of current flows through each of the first and second switches 321 and 322, and where the amount of current exceeds a maximum current rating (breakdown current threshold) this may cause damage on the first switch 321 and the second switch 322. Accordingly, the MGECU 502 performs PWM control for the switches constituting the power converter 300 such that two switches connected in series between two power lines do not simultaneously turn ON.

However, due to some failure, the state of the switch (i.e. ON and OFF) may become unstable. For example, when controlling the second switch 322 to be in the ON state, the first switch 321 may turn ON from OFF state. In this case, the voltage being applied to the second switch 322 rapidly changes with time.

As described, switches constituting the inverter 320 and the converter 310 are configured by n-channel IGBTs. Hence, each of the switches has parasitic capacitance. As the parasitic capacitance, there are a feedback capacitance formed between the gate electrode and the collector, an input capacitance formed between the gate electrode and the emitter, and an output capacitance formed between the collector and the emitter.

In the case where application voltage of the second switch 322 being in the ON state rapidly changes, current flows through the gate electrode via the feedback capacitance. Thus, electric charge is charged in the gate electrode of the second switch 322. The gate voltage of the second switch 322 increases and the ON resistance of the second switch decreases. As a result, an amount of conduction current of the second switch 322 increases. Thus, the second switch 322 may suffer damage.

Also, the first switch 321 may be fixed to the ON state. When switching the second switch 322 to be in the ON state while the first switch 321 has been fixed to the ON state, current flowing through the first and second switches 321 and 322 may exceed the maximum current rating. Hence, the first and second switches may suffer damage.

As described, an increase in an amount of conduction current may cause damage to the switches in the power converter 300. In order to minimize such damage, the suppressing circuit 10 is connected to the gate electrode of the switch. According to the present embodiment, as shown in FIG. 1, the suppressing circuit 10 is connected to each gate electrode of a plurality of switches constituting the converter 310 and the inverter 320.

Figure 2:
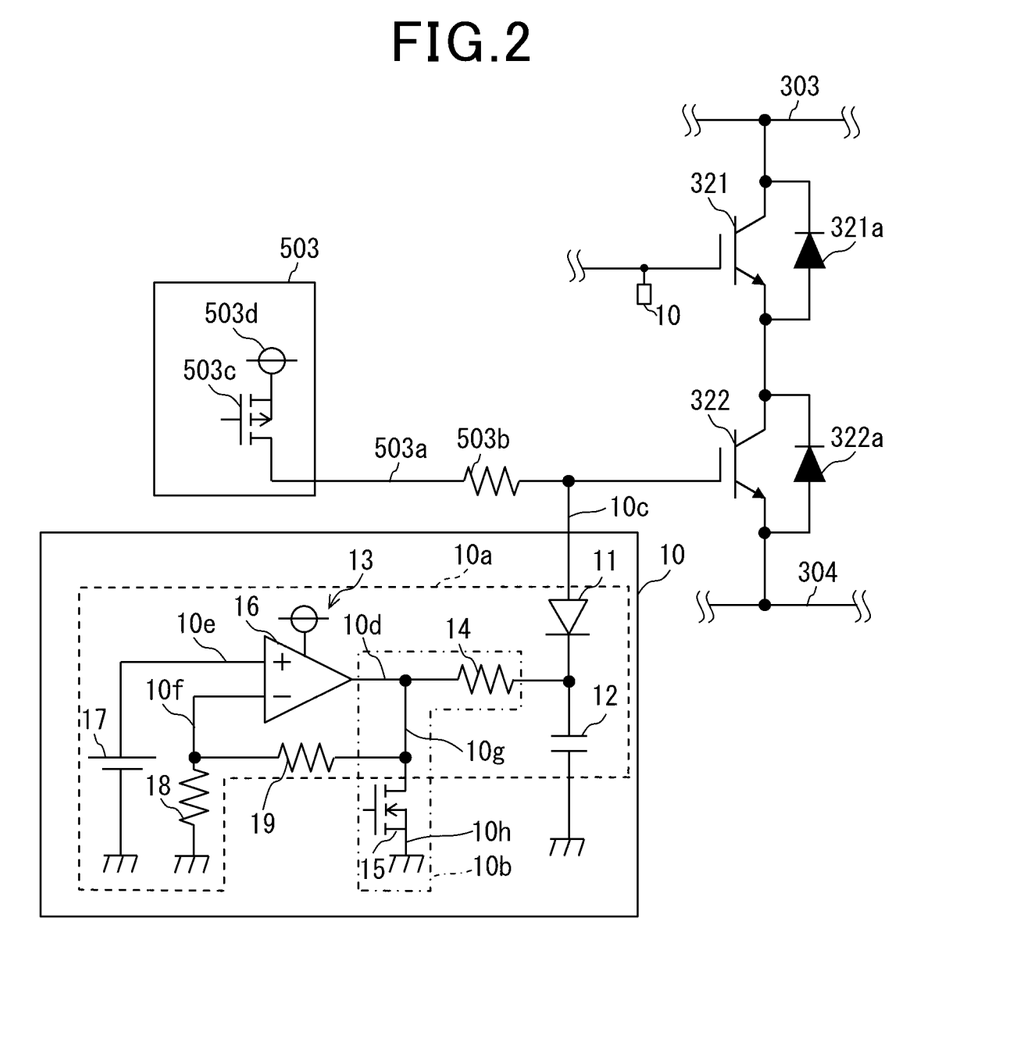
FIG. 2 is a circuit diagram illustrating a suppressing circuit of a first embodiment of the present disclosure.

Suppressing circuit and Gate driver:

As shown in FIG. 2, the suppressing circuit 10 is connected to a control wiring 503a that connects the gate driver 503 and the gate electrode of the power converter 300. A balancing resistor 503b is connected to the control wiring 503a. The suppressing circuit 10 is connected to a first neutral point between the balancing resistor 503b and the gate electrode.

The gate driver 503 includes a switch 503c and a power source 503d. The switch 503c and the balancing resistor 503b are connected in series in this order from the power source 503d to the gate electrode.

The switch 503c is configured as a P-channel MOSFET. A drive signal based on the control signal outputted from the MGECU 502 is outputted to the gate electrode of the switch 503c. Thus, the switch 503 is controlled to be ON and OFF.

When the switch 503c changes the state from OFF to ON, the voltage at the power source 503d (i.e. power source voltage) which has been dropped by the balancing resistor 503b is applied to the gate electrode. Thus, the switch of the power converter 300 turns ON from the OFF state. On the other hand, when the switch 503c turns OFF from the ON state, the power source voltage is no longer applied to the gate electrode. Thus, the switch of the power converter 300 turns OFF from the ON state.

Configuration of Suppressing circuit:

Next, the configuration of the suppressing circuit 10 will be described with reference to FIG. 2. In FIG. 2, the suppressing circuit 10 connected to the gate electrode of the second switch 322 is illustrated in detail. The suppressing circuits 10 connected to each gate electrode of other switches are the same as the suppressing circuit 10 connected to the gate electrode of the second switch 322. Hence, explanation is omitted for the suppressing circuit 10 connected to each of the gate electrode of other switches.

The suppressing circuit 10 includes a diode 11, a capacitor 21, a constant voltage circuit 13, an adjusting resistor 14, and a cutoff switch 15. The diode 11, the capacitor 12, the constant voltage circuit 13 and the adjusting resistor 14 constitute a clamp circuit 10a. The adjusting resistor 14 and the cutoff switch 15 constitute an OFF circuit 10b. The clamp circuit 10a and the OFF circuit 10b shares the adjusting resistor 14.

A first neutral point of the control wiring 503a and the ground are connected via a first ground wiring 10c. The diode 11 and the capacitor 12 are provided on the first ground wiring 10c. The diode 11 and the capacitor 12 are series-connected in this order from the first neutral point to the ground. The anode of the diode 11 is connected to the first neutral point. The cathode of the diode 11 is connected to the capacitor 12. The ground corresponds to reference potential.

The constant voltage circuit 13 is electrically connected to the second neutral point between the diode 11 and the capacitor 12 on the first grand wiring 10c. The constant voltage circuit 13 includes an operational amplifier 16, a reference power source 17, a first feedback resistance 18 and a second feedback resistance 19.

The first operational amplifier (i.e. op-amp) 16 includes a non-inverting input terminal and an inverting input terminal. The output wiring 10d is connected to the output terminal of the operational amplifier. The first input wiring 10e is connected to the non-inverting input terminal. The second input wiring 10f is connected to the inverting input terminal.

As shown in FIG. 2, one end of the output terminal 10d is connected to the output terminal of the first op-amp 16. The other end of the output wiring 10d is connected to the second neutral point of the first ground wiring 10c. An adjusting resistor 14 is provided on the output wiring 10d.

The one end of the first input wiring 10e is connected to the non-inverting input terminal of the op-amp 16. The other end of the first input wiring 10e is connected to the ground. The reference power source 17 is disposed on the first input wiring 10e.

The one end of the second input wiring 10f is connected to the inverting input terminal of the op-amp 16. The other end of the second input wiring 10f is connected to the ground. The first feedback resistor 18 is disposed on the second input wiring 10f.

The output wiring 10d and the second input wiring 10f are connected via the feedback wiring 10g. The one end of the feedback wiring 10g is connected to the third neutral point between the output terminal and the adjusting resistor 14 on the output wiring 10d. The other end of the feedback wiring 10g is connected to the fourth neutral point between the inverting input terminal and the first feedback resistor 18 on the second input wiring 10f. The second feedback resistor 19 is provided on the feedback wiring 10g.

Thus, the above-described configuration includes the op-amp 16, the reference power source 17, and the second feedback resistor 19 to constitute the constant voltage circuit. A constant reference voltage of the reference power source 17 and a constant output voltage (constant voltage) depending on the resistance of the first feedback resistor 18 and the second feedback resistor 19, are outputted from the outpour terminal of the op-amp 16. The constant voltage is outputted to the second neutral point between the diode 11 and the capacitor 12 via the adjusting resistor 14. Thus, the voltage at the cathode of the diode 11 and the voltage (electric charge) at the capacitor 12 are constant.

As described, the output terminal of the op-amp 16 is connected to the second neutral point via the adjusting resistor 14. The output terminal of the op-amp 16 is connected to the ground via the adjusting resistor 14 and the capacitor 12. The adjusting resistor 14 and the capacitor 12 constitutes a compensation circuit in order to reduce an oscillation of the op-amp.

The one end of the second ground wiring 10h is connected to the fifth neutral point between the connection point of the output wiring 10d and the feedback wiring 10g, and the second feedback resistor 19. The cutoff switch 15 is provided on the second ground wiring 10h. Note that the fifth neutral point has the same voltage as that of the third neutral point.

The gate electrode of the second switch 322 is connected to the ground via the diode 11, the adjusting resistor 14 and the cutoff switch 15. When turning the cutoff switch 15 to the ON state from the OFF state, the gate electrode of the second switch 322 is connected to the ground via the diode 11 and the adjusting resistor 14.

Note that the MGECU 502 drives the op-amp 16 and the cutoff switch 15. The on-vehicle system 100 includes a current sensor and a voltage sensor which are not shown. The outputs of these sensors are outputted to the MGECU 502. The MGECU 502 determines whether a fault has occurred in the switches constituting the power converter 300, based on the outputs of the outputs of these sensors. When determined that a fault has occurred in which large amount of current flows through the switches, the MGECU 502 stops driving the op-amp 16 and controls the cutoff switch 15 to be in the ON state.

Operation of Suppressing Circuit:

Next, operation of the suppressing circuit 10 will be described. When it is assumed that the application voltage of the second switch 322 rapidly changes, current flows into the gate electrode via the feedback capacitance. Thus, the gate voltage of the second switch 322 increases and the ON resistance of the second switch 322 decreases. Further, the current flowing through the second switch 322 increases.

However, as described above, the anode of the diode 11 is connected to the gate electrode of the second switch 322. Hence, when the voltage of the gate electrode increases, the voltage at the anode of the diode 11 increases. In the case where the voltage difference between the anode and the cathode exceeds the forward voltage of the diode 11, current flows into the capacitor 12. Thus, an increase in the voltage at the gate electrode is suppressed. The ON resistance of the second switch 322 is prevented from decreasing. The current flowing through the second switch 322 is prevented from increasing.

The voltage at the capacitor 12 increases when the capacitor 12 is being charged via the diode. Then, the voltage at the cathode of the diode 11 increases. Hence, in the case where the voltage at the anode does not increase when the voltage at the cathode increases, the voltage across the diode does not exceed the forward voltage of the diode 11. As a result, an increase in the voltage at the gate electrode cannot be suppressed.

As described above, the constant voltage circuit 13 is connected to the second neutral point between the diode 11 and the capacitor 12 via the adjusting resistor 14. For this reason, the voltage at the second neutral point is maintained to be constant by the constant voltage circuit 13. Thus, an increase in the voltage of the cathode is suppressed. As a result, the voltage difference between the cathode and the anode is prevented from being a voltage not to exceed the forward voltage of the diode 11. Hence, an increase in the voltage at the gate electrode is suppressed and an increase in the current flowing through the second switch 322 is suppressed.

As described above, the diode 11, the capacitor 12, the constant voltage circuit 13 and the adjusting resistor 14 constitutes the clamp circuit 10a that suppresses an increase in the voltage of the gate electrode.

Also, the cutoff switch 15 is disposed on the second ground wiring 10h that connects the fifth neutral point and the ground. Hence, when the cutoff switch 15 is turned ON, the gate electrode of the second switch 322 is connected to the ground via the adjusting resistor 14. Thus, in the case where electric charge is charged at the gate electrode of the second switch 322, the electric charge is withdrawn to the ground. As a result, the second switch 322 is forced to be OFF. Hence, it is avoided that the current flows through the second switch 322.

In the case where the above-described adjusting resistor 14 is not present and a large amount of current is flowing through the second switch 322, when turning the cutoff switch 15 ON, the gate electrode of the second switch 322 and the ground are connected with low impedance. Thus, surge voltage is generated. However, as described above, even if the cutoff switch 15 is turned ON, the gate electrode of the second switch 322 is connected to the ground via the adjusting resistor 14. Thus, the gate electrode and the ground are prevented from being connected with low impedance. Hence, surge voltage is prevented from being generated.

Thus, the adjusting resistor 14 and the cutoff switch 15 constitutes an OFF circuit 10b that forcibly turns OFF the second switch 322 when a large amount of current flows.

As described above, the clamp circuit 10a and the OFF circuit 10b share the adjusting resistor 14. The adjusting resistor 14 serves as a compensation circuit that suppresses oscillation of the op-amp 16. Moreover, the adjusting resistor 14 suppresses occurrence of the surge voltage. The resistance value of the adjusting resistor 14 is determined so as to satisfy the above-mentioned functions of the compensation circuit and the surge suppression circuit.

Also, the capacitance of the capacitor 12 that constitutes the compensation circuit together with the adjusting resistor 14 is determined such that electric charge flowing from the gate electrode of the switch in the power converter 300 is sufficiently charged. Further, the capacitance of the capacitor 12 is determined depending on a required period from when detecting a fault in which over current flows through the power converter 300 to when the switch of the power converter 200 is forcibly turned OFF from ON state. The capacitance of the capacitor 12 is determined so as to satisfy these two requirements.

Effects and Advantages:

Next, effects and advantages of the suppressing circuit 10 will be described. As described above, the diode 11, the capacitor 12, the constant voltage circuit 13 and the adjusting resistor 14 constitute the clamp circuit 10a that suppresses an increase in the voltage at the gate electrode. The adjusting resistor 14 and the cutoff switch 15 constitute the OFF circuit 10b that forcibly turns OFF the second switch 322. These clamp circuit 10a and the OFF circuit 10b effectively suppresses an increase in an amount of current flowing through the second switch 322.

The clamp circuit 10a and the OFF circuit 10b shares the adjusting resistor 14. Hence, an increase in the number of components can be suppressed compared to a configuration in which the clamp circuit and the OFF circuit are separated and each circuit is provided with an individual adjusting resistor.

The MGECU 502 stops driving the op-amp 16 when turning the cutoff switch 15. Thus, useless current is prevented from flowing to the ground from the op-amp 16 via the cutoff switch 15. Further, an increase in the power consumption is suppressed.

Second Embodiment

Figure 3:
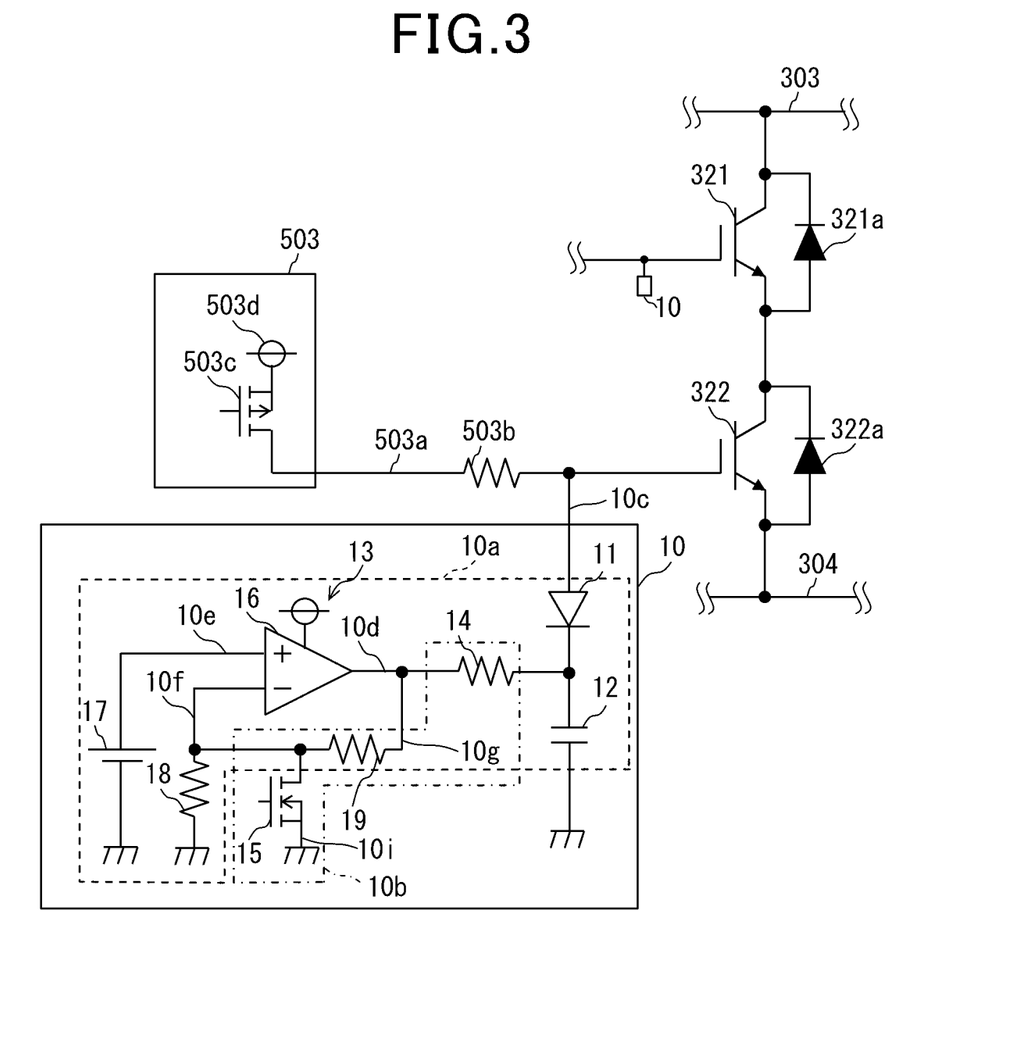
FIG. 3 is a circuit diagram illustrating a suppressing circuit of a second embodiment of the present disclosure.

Next, a second embodiment will be described with reference to FIG. 3. The suppressing circuits which will be described in the following respective embodiments have configurations similar to those described in the first embodiment. Hence, description of these similar configuration will be omitted, and configurations different from the first embodiment will be mainly described. Also, the same reference numbers are applied to configurations as same as that of the first embodiment.

According to the first embodiment, an example is described in which the cutoff switch 15 is disposed on the second ground wiring 10h that connects the fifth neutral point and the ground. The fifth neutral point is disposed between the connection point between the feedback wiring 10g and the output wiring 10d and the second feedback resistor 19. On the other hand, according to the present embodiment, the third ground wiring 10i is disposed at the sixth neutral point between the connection point between the feedback wiring 10g and the second input wiring 10f, and the second feedback resistor 19. One end of the third ground wiring 10i is connected to the sixth neutral point. The other end of the third ground wiring 10i is connected to the ground. The cutoff switch 15 is disposed on the third ground wiring 10i. Note that the sixth neutral point has the same potential as that of the fourth neutral point.

Thus, when turning the cutoff switch 15 ON, the gate electrode of the second switch 322 is connected to the ground via the diode 11, the adjusting resistor 14 and the second feedback resistor 19. Hence, compared to a configuration in which the gate electrode is connected to the ground via the one resistor, electric charge charged in the gate electrode can be gradually withdrawn. Thus, surge voltage can be effectively prevented from occurring.

Further, adjustment of the resistance value in order to prevent surge voltage from occurring can be determined by the adjusting resistor 14 and the second feedback resistor 19.

The suppressing circuit 10 according to the present embodiment includes the same elements as those in the suppressing circuit 10 of the first embodiment. Hence, the same effects and advantages as those in the first embodiment can be obtained. The same applies in the following respective embodiments and modifications thereof.

Third Embodiment

Figure 4:
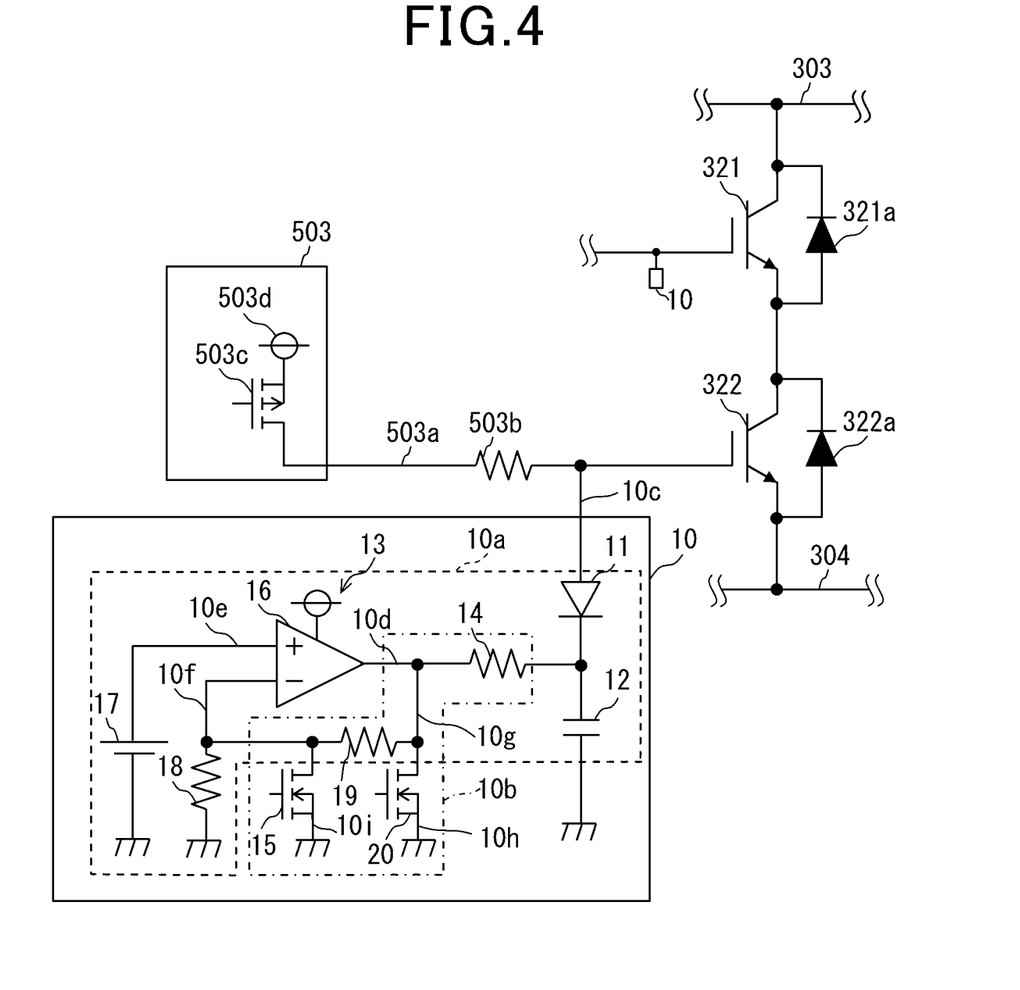
FIG. 4 is a circuit diagram illustrating a suppressing circuit of a second embodiment of the present disclosure.

Next, the third embodiment will be described with reference to FIG. 4.

According to the second embodiment, an example was described in which the cutoff switch 15 is provided on the third ground wiring 10i. In contrast, according to the third embodiment, the cutoff switch 15 is provide and a normal OFF switch 20 is provided on the second ground wiring 10h.

According to the configuration of the third embodiment, a normal OFF switch 20 is controlled to be in the ON state so as to perform a power conversion, while controlling the switches constituting the power converter 300.

Similar to the suppressing circuit 10 described in the second embodiment, the cutoff switch 15 is controlled to be in the ON state when a large amount of current flows. Thus, the switches of the power converter 300 are fixed to OFF state while suppressing occurrence of the surge voltage.

Figure 5:
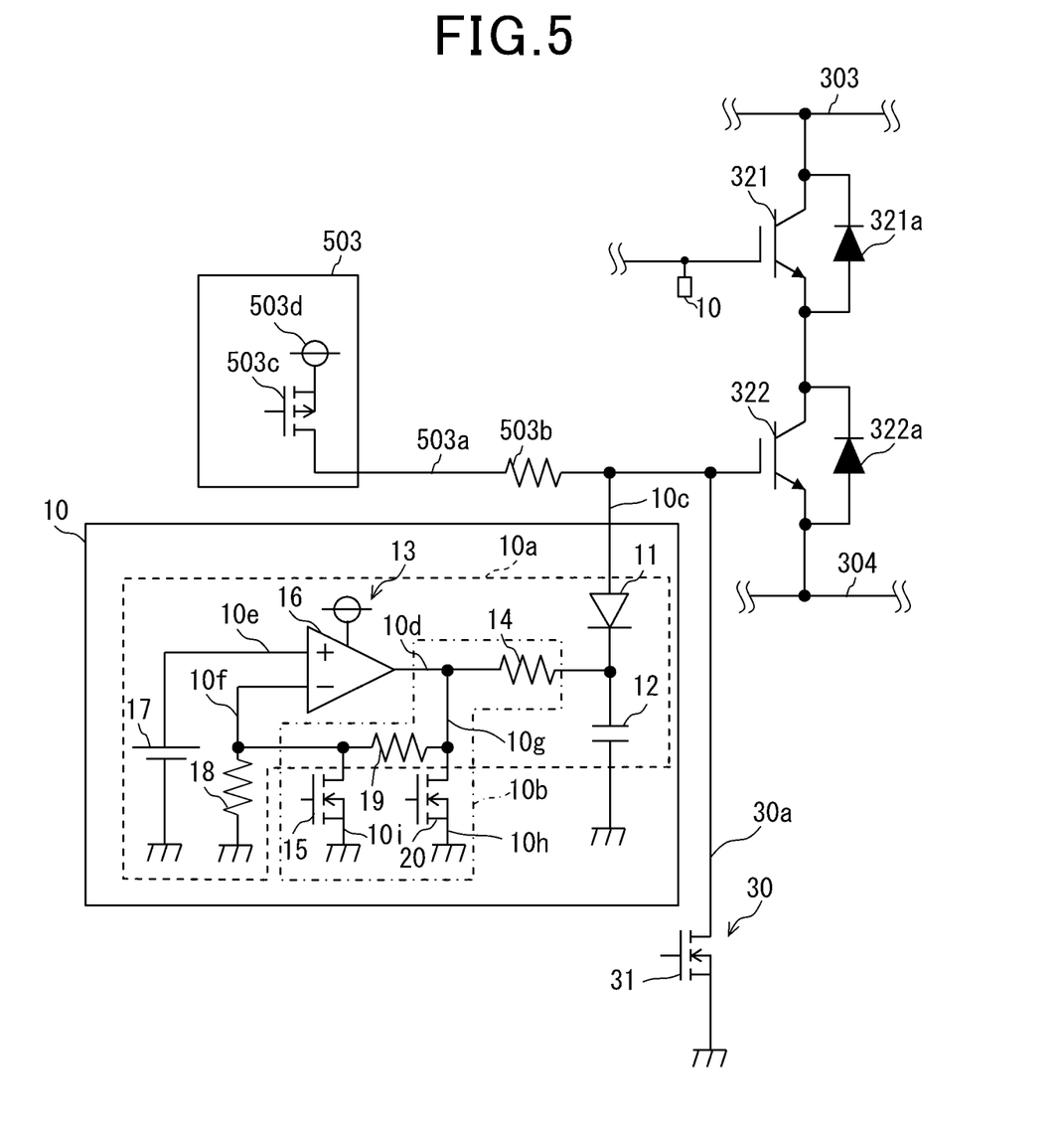
FIG. 5 is a circuit diagram illustrating an OFF holding switch.

As shown in FIG. 5, a configuration may be utilized in which an OFF holding circuit 30 is connected to the control wiring 503a so as to control the switches of the power converter 300 to be in the OFF state with low impedance. The OFF holding switch 30 includes an OFF holding switch 31 disposed on the fourth ground wiring 30a that connects the first neutral point of the control wiring 503a and the ground.

The OFF holding switch 31 is controlled to be in the ON state after turning the cutoff switch 15 or the normal OFF switch 20 to be in the ON state. The cutoff switch 15 or the normal OFF switch 20 are turned to be in the ON state, thereby withdrawing electric charge charged in the gate electrode into the ground. Thus, after withdrawing electric charge of the gate electrode, the OFF holding switch is fixed to the ON state. Thereafter, the cutoff switch 15 and the normal OFF switch 20 are controlled to be OFF in the state. With the above-described control, the gate electrode is connected to the ground with low impedance. The switches of the power converter 300 are fixed to the OFF state.

In the foregoing description, preferred embodiments of the present disclosure are described. However, the present disclosure is not limited to the above-described embodiments, and may be modified in various ways without departing the spirit of the present disclosure.

Other Embodiments

According to the above-described embodiments, a configuration was exemplified in which the suppressing circuit 10 is connected to the gate electrode of the power converter 300 constituting the on-vehicle system used for electric vehicle. However, the disposition of the suppressing circuit 10 is not limited to the above-described examples. For example, the suppressing circuit 10 may be connected to the gate electrode of each switch in the power converter of the hybrid system provided with a motor and an internal combustion engine.

Figure 6:
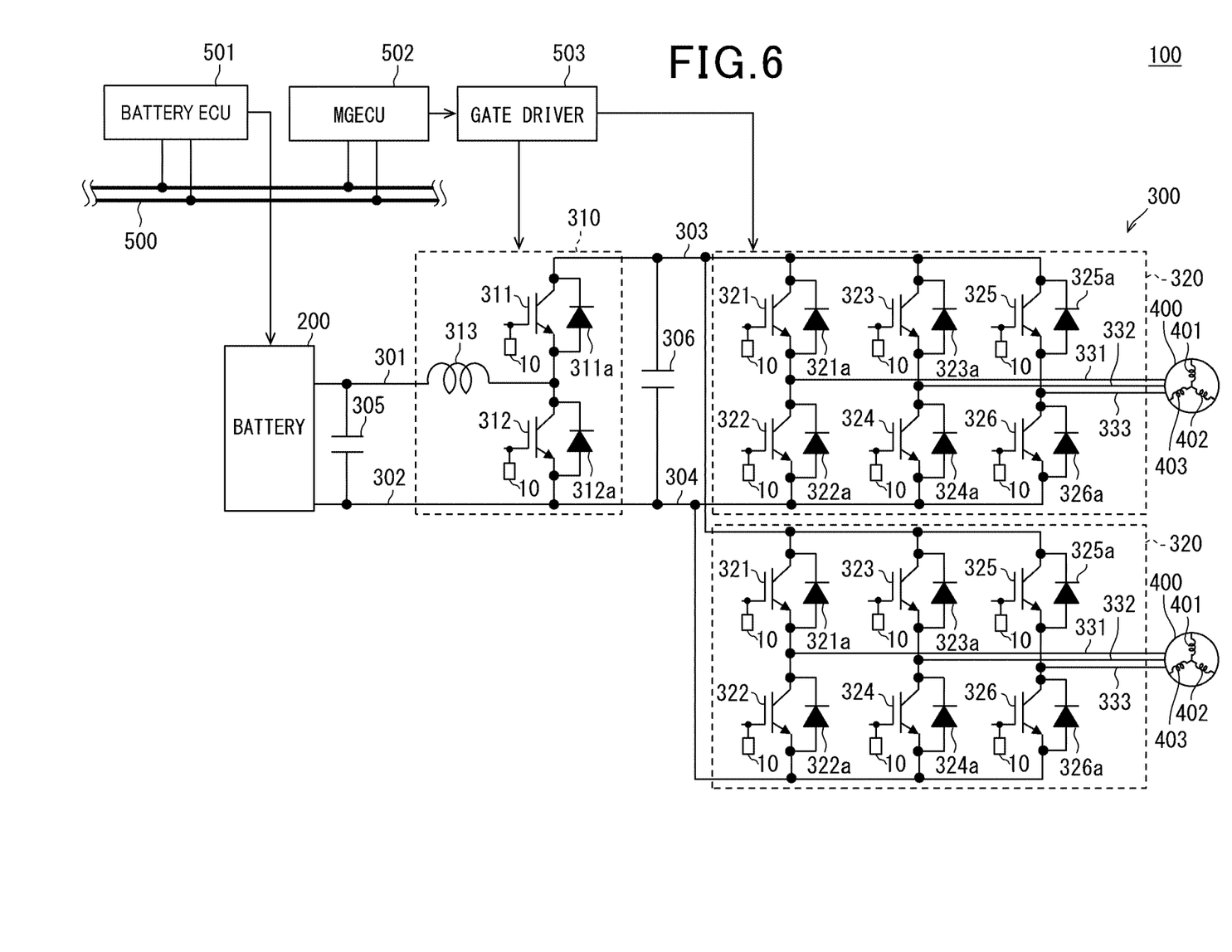
FIG. 6 is a circuit diagram illustrating a modification of the on-vehicle system.

According to the above-described embodiments, a configuration was exemplified in which the power converter 300 includes a single converter 410 and a single inverter 320. However, as shown in FIG. 6, in the case where the on-vehicle system 1 includes two motors 400, the power converter 300 may be provided with a single converter 310 and two inverters 320.

According to the above-described embodiments, detailed configuration of the suppressing circuit 10 was not suggested. However, a part of elements of the suppressing circuit 10 may be disposed on the wiring board and remaining elements may be included in an integrated circuit (IC) chip. Specifically, the diode 11, the capacitor 12 and the adjusting resistor 14 are mounted on the wiring board and remaining elements such as the constant voltage circuit 13 and the cutoff switch 15 may be included in an IC chip.

According to the above-described configuration, elements of the clamp circuit 10a and the OFF circuit 10b which are included in the IC chip share the output pin of the IC chip. Thus, the number of output pins of the IC chip is prevented from increasing.

According to the first embodiment, a configuration was exemplified in which the cutoff switch 14 is disposed on the second ground wiring 10h. However, a configuration including the normal OFF switch 20 disposed on the second wiring 10h may be employed. In this case, the resistance of the adjusting resistor 14 is determined depending on a required transient period for the switch of the power converter 300 to turn OFF from the ON state. In the case where an amount of surge voltage is small enough to be ignored, the normal OFF switch 20 may be controlled to be in the ON state when the power converter 300 is in a fault condition.

Further, a configuration may be employed, in which OFF holding switch 31 is disposed on the second ground wiring 10h. According this configuration, the resistance value of the adjusting resistor 14 is set to be a suitable value for connecting the gate electrode of the power converter 300 to the ground with low impedance. In the case where an amount of surge voltage is small enough to be ignored, the OFF holding switch 31 may be controlled to be in the ON state when the power converter 300 is in a fault condition.

As described, a suppressing circuit that suppresses conduction of the transistor, an OFF circuit is generally known, which forcibly turns the transistor OFF. The OFF circuit and the clamp circuit disclosed in the above-mentioned patent literature are provided in the transistor. Thus, an increase in the current flowing through the transistor can be effectively suppressed.

However, in the conventional suppressing circuit, there is a concern that the number of components in the switch circuit may increase in the case where both of the clamp circuit and the OFF circuit are provided in the transistor. In this respect, the present disclosure provides a suppressing circuit that effectively suppresses increase in the number of components and increase in the current flowing through the transistor.

Specifically, the present disclosure provides a suppressing circuit including a diode of which an anode is connected to a first neutral point between a drive circuit and a control electrode of a semiconductor switch; a capacitor disposed between a cathode of the diode and a reference potential; a constant voltage circuit connected to a second neutral point between the diode and the capacitor; an adjusting resistor disposed between the constant voltage circuit and the second neutral point; and a cutoff switch disposed between a constant voltage circuit side of the adjusting resistor and the reference potential.

As it has been described in more detail in the foregoing embodiments, a diode, a capacitor, a constant voltage circuit, and an adjusting resistor of the present disclosure constitute a clamp circuit to suppresses an increase in a potential of the control terminal. Also, the adjusting resistor and the cutoff switch of the present disclosure constitutes an OFF circuit that forcibly turns the semiconductor switch to be OFF. As a result, the clamp circuit and the OFF circuit effectively suppresses an increase in an amount of current flowing thorough the semiconductor switches.

The clamp circuit and the OFF circuit share the adjusting resistor. Therefore, an increase in the number of components is suppressed compared to a configuration in which the clamp circuit and the OFF circuit are individually provided including respective adjusting resistors.

What is claimed is:
1. A suppressing circuit comprising:
a diode of which an anode is connected to a first neutral point between a drive circuit and a control electrode of a semiconductor switch;
a capacitor disposed between a cathode of the diode and a reference potential;
a constant voltage circuit connected to a second neutral point between the diode and the capacitor;
an adjusting resistor disposed between the constant voltage circuit and the second neutral point; and
a cutoff switch disposed between a constant voltage circuit side of the adjusting resistor and the reference potential, wherein
the constant voltage circuit includes an op-amp provided with an output terminal and an input terminal, and a feedback resistor disposed between the output terminal and the input terminal; and
the cutoff switch is disposed between a portion between the input terminal and the feedback resistor, and the reference potential.

2. The suppression circuit according to claim 1 further comprising:
   an OFF switch disposed between a portion between the output terminal and the adjusting resistor, and the reference potential.

3. A suppressing circuit comprising:
   a diode of which an anode is connected to a first neutral point between a drive circuit and a control electrode of a semiconductor switch;
   a capacitor disposed between a cathode of the diode and a reference potential;
   a constant voltage circuit connected to a second neutral point between the diode and the capacitor;
   an adjusting resistor disposed between the constant voltage circuit and the second neutral point; and
   a cutoff switch disposed between a constant voltage circuit side of the adjusting resistor and the reference potential, wherein
   the constant voltage circuit includes an op-amp provided with an output terminal and an input terminal, and a feedback resistor disposed between the output terminal and the input terminal;
   the cutoff switch is disposed between a portion between the output terminal and the adjusting resistor, and the reference potential; and
   the op-amp is controlled to be an OFF state when the cutoff switch is controlled to be in the ON state.

* * * * *